United States Patent
Wang

[19]

[11] Patent Number: 5,926,723
[45] Date of Patent: Jul. 20, 1999

[54] GENERATION OF A LOOSE PLANARIZATION MASK HAVING RELAXED BOUNDARY CONDITIONS FOR USE IN SHALLOW TRENCH ISOLATION PROCESSES

[75] Inventor: Larry Yu Wang, San Jose, Calif.

[73] Assignee: Advanced Micro Devices, Inc., Sunnyvale, Calif.

[21] Appl. No.: 08/813,008

[22] Filed: Mar. 4, 1997

[51] Int. Cl.$^6$ .................................................... H01L 21/76
[52] U.S. Cl. ...................... 438/437; 438/435; 438/691; 438/692; 438/791
[58] Field of Search .................................... 438/435, 424, 438/437, 692, 691, 791, 944, 946

[56] References Cited

U.S. PATENT DOCUMENTS 4,954,459  9/1990  Avanzino et al. ...................... 437/228
5,691,215  11/1997  Dai et al. .
5,789,286  8/1998  Subbanna .
5,804,492  9/1998  Shen .
5,811,345  9/1998  Yu et al. .

*Primary Examiner*—Charles Bowers
*Assistant Examiner*—Martin Sulsky
*Attorney, Agent, or Firm*—Fliesler, Dubb, Meyer & Lovejoy LLP

[57] ABSTRACT

A method of forming an improved planarization mask for shallow trench isolation process area in integrated circuit manufacturing is disclosed. The planarization mask is generated automatically by using actual mask data as a reference. The invention discloses an algorithm which measures the geometric and relative separation distances of the active areas and performs the necessary merging, deletion and differential biasing to produce the planarization mask which has relaxed geometric boundaries, thereby allowing low cost and simplified manufacturing.

19 Claims, 17 Drawing Sheets

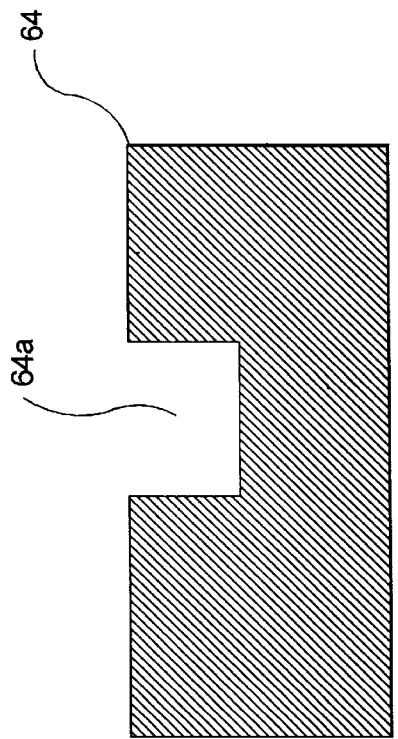
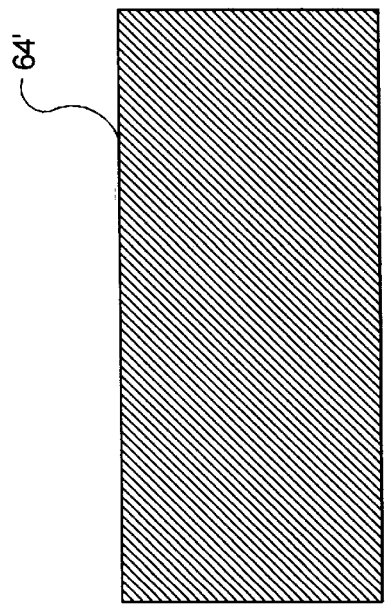
FIG.18a
FIG.18b
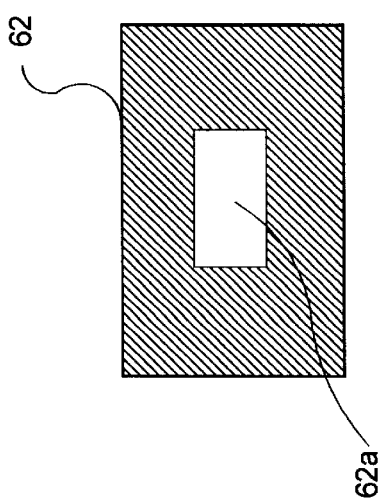

GENERATION OF A LOOSE PLANARIZATION MASK HAVING RELAXED BOUNDARY CONDITIONS FOR USE IN SHALLOW TRENCH ISOLATION PROCESSES

COPYRIGHT NOTICE

A portion of the disclosure of this patent document contains material which is subject to copyright protection. The copyright owner has no objection to the facsimile reproduction by anyone of the patent document or the patent disclosure as it appears in the U.S. Patent and Trademark Office patent file or records, but otherwise reserves all copyright rights whatsoever.

FIELD OF THE INVENTION

This invention generally relates to integrated circuit technology and, more particularly, to an improved method of forming highly planarized oxide portions on integrated circuits through the use of an improved planarization mask.

BACKGROUND OF THE INVENTION

Integrated circuit structures have field oxide grown on the surface of a semiconductor substrate to provide oxide isolation between active regions formed on the semiconductor substrate. The isolation is performed by masking the active regions of the substrate and then oxidizing the remaining portions of the substrate. For example, when growing an oxide layer of a particular thickness, the oxide growth will extend down into the substrate about one-half the total thickness and also extend about one-half the total thickness above the original semiconductor substrate surface. Such a technique, called local oxidation of silicon (LOCOS), is widely used in the semiconductor industry.

An advanced integrated circuit fabrication technique, called shallow trench isolation (STI), is used in forming planar integrated circuit topographies. In the STI manufacturing process, a silicon trench is etched and then filled with a non-conducting material such as oxide. A planarization step is performed to remove the previously deposited oxide from the top of the active areas while keeping the silicon trenches filled with oxide. The active areas are then ready to have active devices built on them while the oxide filled trench regions provide electrical isolation. U.S. Pat. No. 4,954,459, which is assigned to the same assignee as the present application, describes a planarization method using a reverse etch mask to etch away oxide present in the active areas to achieve a first order planarization which is then followed by a chemical and mechanical polish (CMP) to complete the planarization process.

While the conventional manufacturing methods described above provide planarized structures, they are not well suited to provide the small planarized active regions required in present IC structure.

SUMMARY OF THE INVENTION

The present invention solves the aforementioned and related drawbacks associated with highly planarized integrated circuit structures having very dense active regions. A method of providing a planarization layer using a novel planarization mask is provided. The planarization mask provides that photoresist is placed only where needed within a semiconductor structure. Very narrow spaces between active regions where resist actually is needed for reverse masking schemes are removed. Thus, the planarization mask can be made much more loosely as compared to conventional methods, allowing less expensive lithographic techniques to be used during manufacturing.

The mask used to provide the planarization layer is provided by: measuring the width of the active areas formed on a semiconductor substrate; measuring the distance between the adjacent active areas; merging the adjacent active areas of the semiconductor substrate when the measured distance between adjacent active areas is below an initial threshold value; increasing the mask size of an active area when the width of the active area is below a second threshold value; decreasing the mask size over an active area having a width above a third threshold value, and reversing the polarity of the mask. This method results in a mask which opens all of the active areas of an integrated circuit structure. Thus, upon etching of the oxide layer, a highly planarized integrated circuit structure results.

An advantage of the present invention is the ability to loosen the geometry requirements of a photoresist mask to provide for better planarization.

Another advantage of the present invention is that it makes the chemical and mechanical polish process easier by exposing a larger amount of oxide in the active areas which allow them to be removed during planarization etch.

Yet another advantage of the present invention is that it reduces manufacturing costs.

Still another advantage of the present invention is that it allows for the fabrication of high density integrated circuits.

Yet still another advantage of the present invention is that it simplifies the manufacturing process.

A feature of the present invention is that it can be implemented with standard processing techniques.

Another feature of the present invention is that the planarization mask can be produced by an automated process.

BRIEF DESCRIPTION OF THE DRAWINGS

These and other advantages and features of the present invention will become apparent from the following description of the embodiments, taken in conjunction with the accompanying drawings, where like numerals represent like elements, in which:

FIGS. 11–18 illustrate a top view of the development of a planarization mask according to the present invention.

DESCRIPTION OF THE EMBODIMENTS

The present invention is directed to an improved manufacturing process for forming highly planarized topologies on integrated circuit structures by providing a planarization mask having relaxed boundary conditions. The process described below is discussed with respect to shallow trench isolation techniques. However, it may be used in conjunction with any manufacturing technique.

FIGS. 1–7 illustrate an example of a conventional STI manufacturing process for providing a planar integrated circuit structure.

Figure 1:
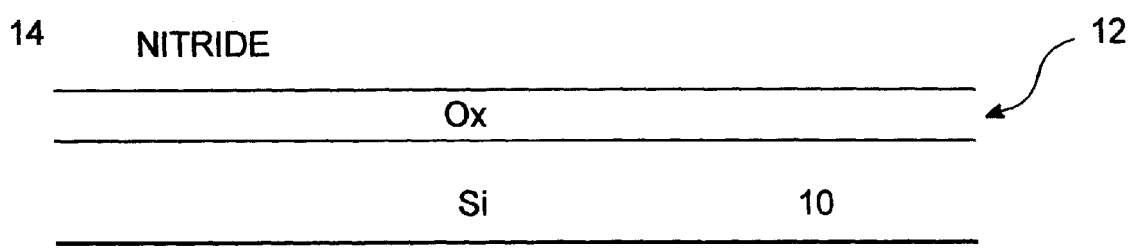
FIGS. 1–7 present schematic cross-sectional side views of a conventional shallow trench isolation process.

As shown in FIG. 1, the process starts with a substrate 10 of p-type semiconductor material such as, for example, silicon having an oxide layer 12 grown thereon. The oxide layer 12 is grown to a thickness of approximately 150 Å. Next, a nitride layer 14 is deposited on the oxide layer 12 using low pressure chemical vapor deposition (LPCVD) techniques.

Following the nitride deposition (FIG. 2), photoresist 16 is applied over the nitride layer 14 which defines a resist pattern of active regions where active devices such as transistors, diodes, capacitors, etc. will be built. A trench etch is then performed to etch away the nitride layer 14 and oxide layer 12 to form a step 13 in the silicon 10 having a depth of between 3000 Å–4000 Å below the top of the silicon surface.

Figure 3:
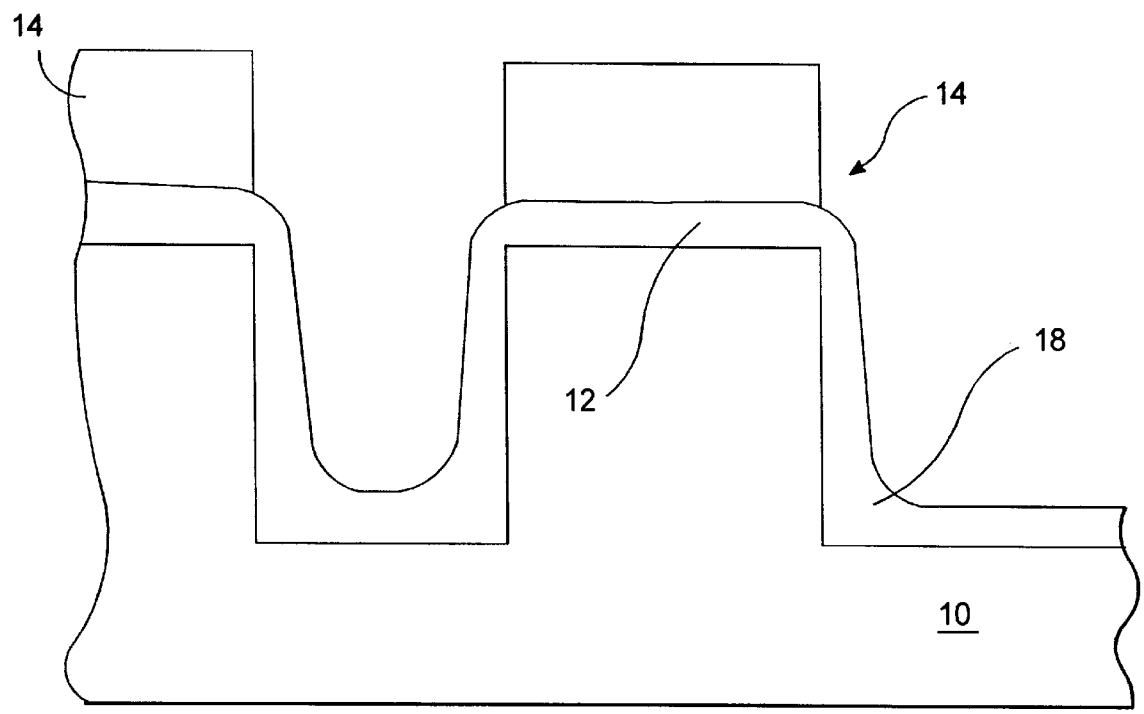

As shown in FIG. 3, the photoresist 16 is removed and a layer of thermal oxide 18 having a thickness of approximately 500 Å is grown inside silicon trench 13.

Figure 2:
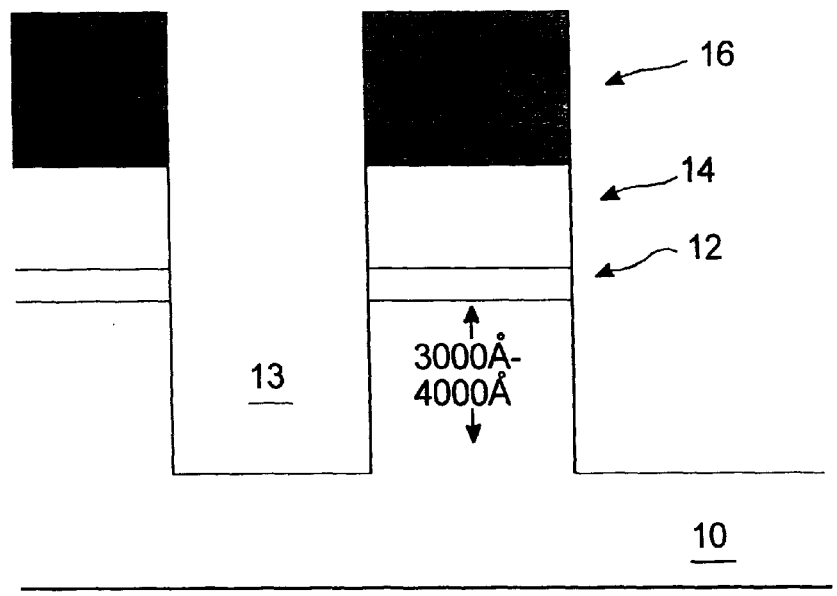
Figure 4A:
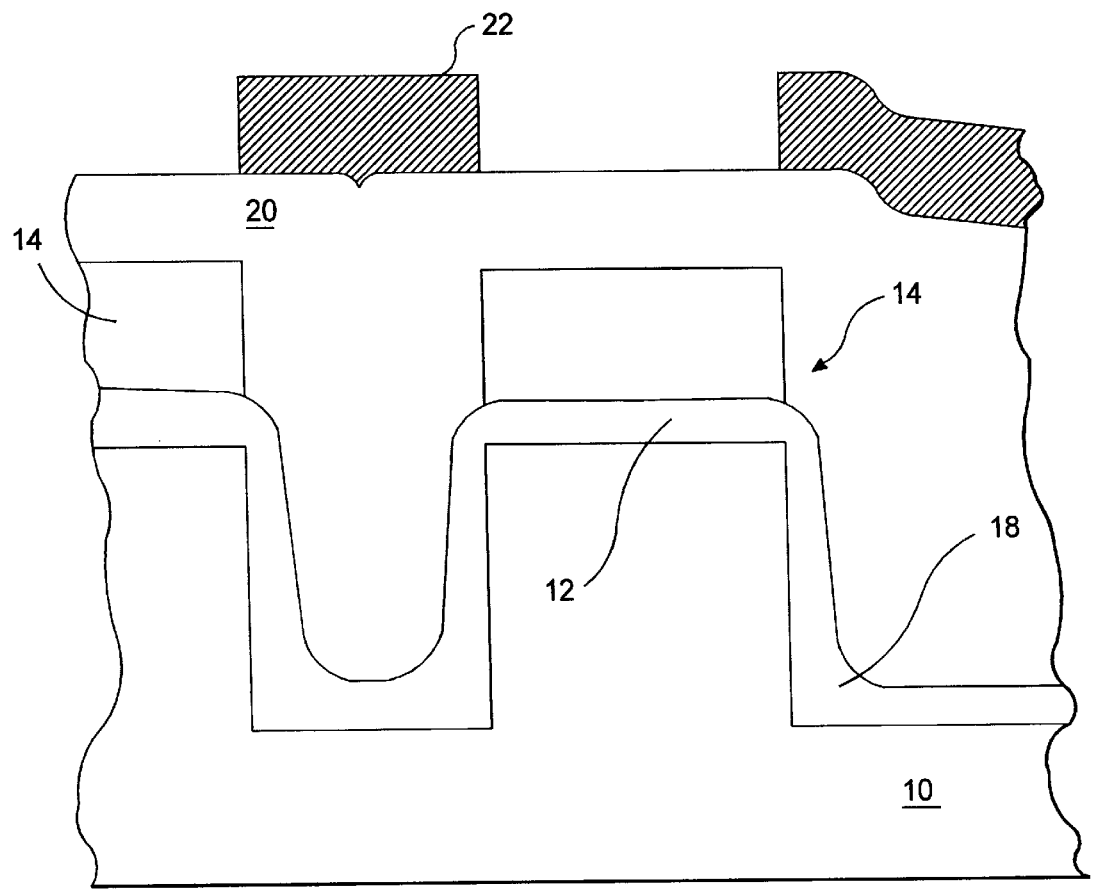

Next, as shown in FIG. 4a, a layer of conformal oxide 20 having a thickness of approximately 6200 Å is deposited at a temperature in the range of between 700° C.–800° C. over the structure. The conformal oxide 20 is preferably a highly conformal oxide such as, for example, LPCVD tetraethyl orthosilicate (TEOS). Another layer of photoresist 22, having a polarity opposite of the photoresist layer 16 is applied in FIG. 2, is used to form the resist mask pattern which defines the field (isolation) regions.

Figure 5:
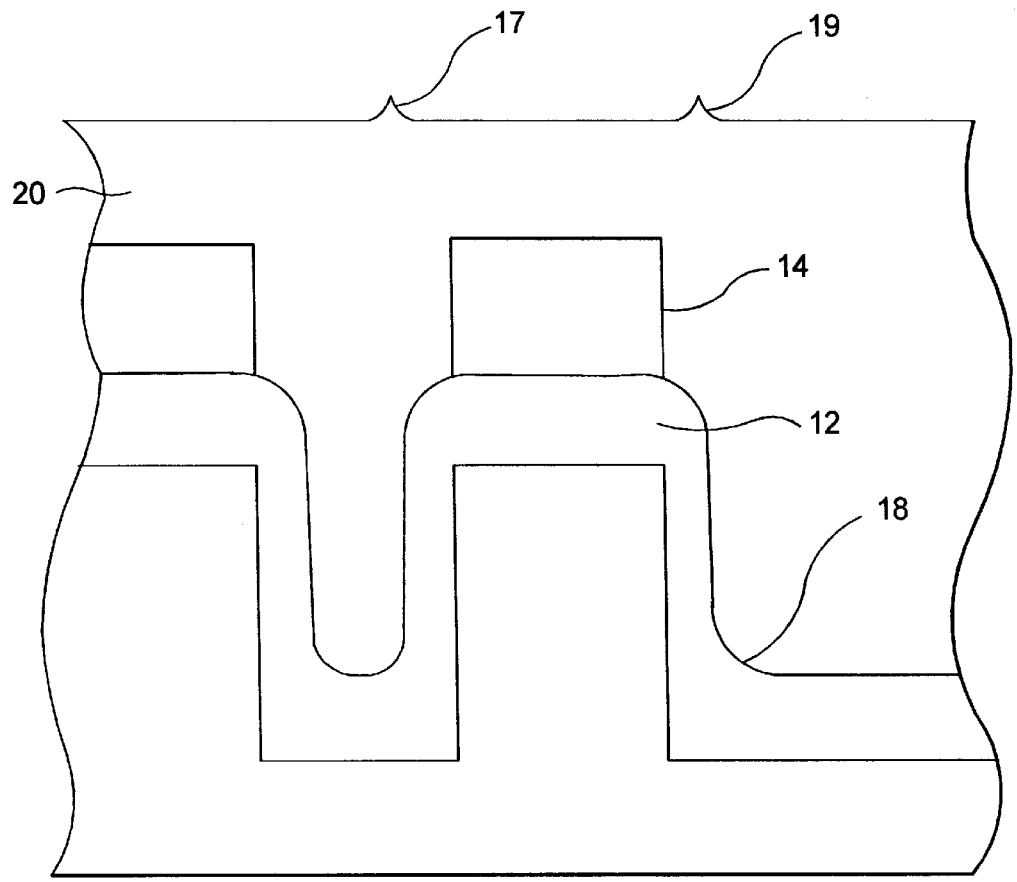
Figure 6:
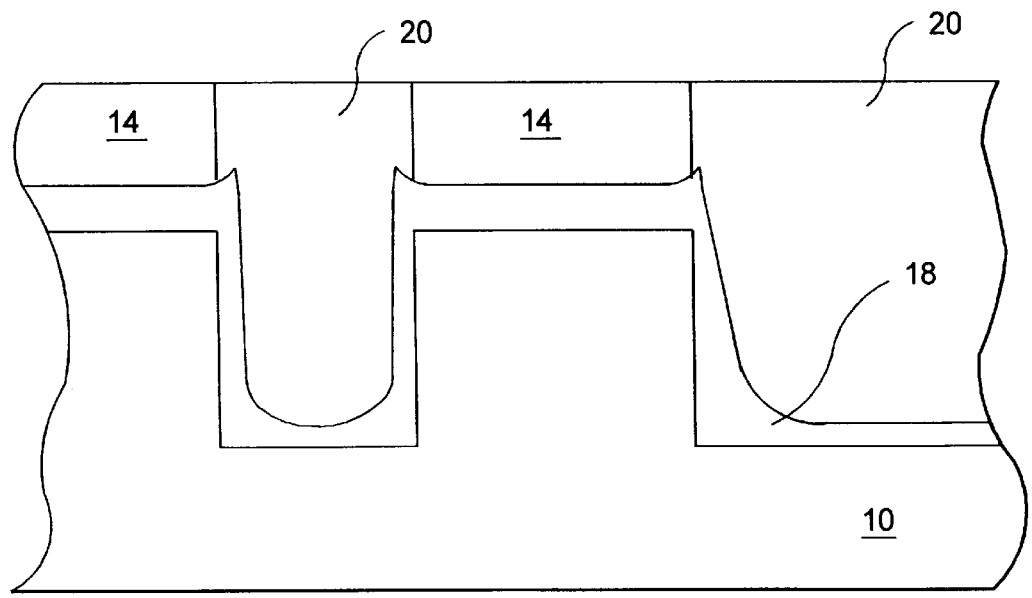

After the resist mask 22 has been placed over the isolation regions, an etch is performed, generally an isotropic etch, achieved by either wet chemistry (such as diluted HF) or by reactive ion etching (RIE) to etch the conformal oxide layer 20 down to a distance approximately 800 Å above the nitride layer 14 as shown in FIG. 5. After the etching step, two pillars 17, 19 are present at the junction between the conformal oxide 20 and the photoresist mask 22. A CMP is then performed to remove the pillars 17, 19 to achieve global planarization as shown in FIG. 6. The resulting structure, shown in FIG. 6, has a more planar topography than the structure shown in FIG. 4.

Figure 7A:
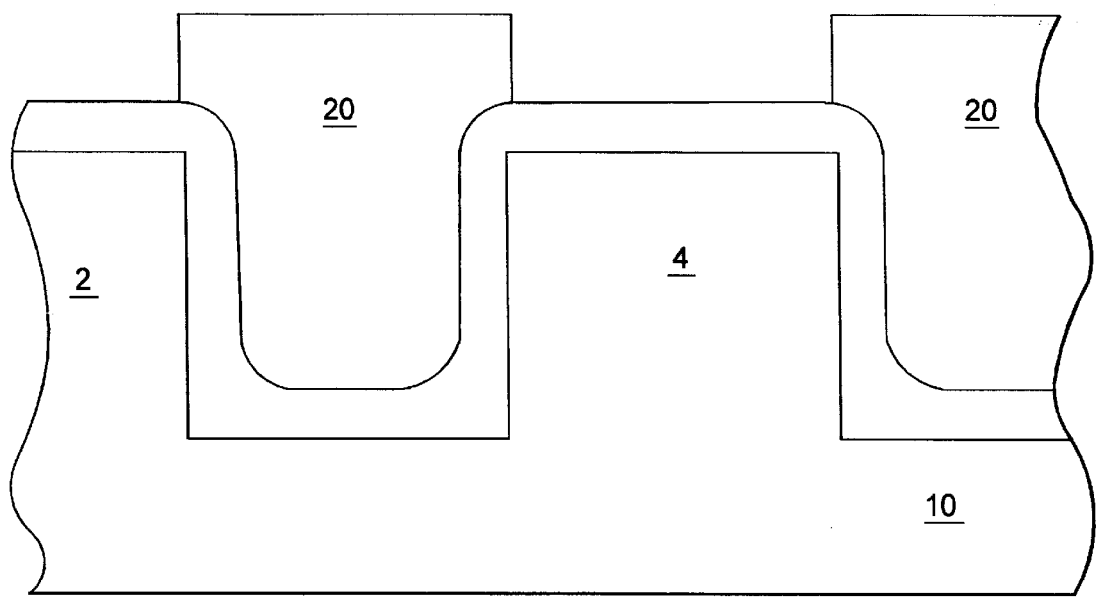
Figure 7B:
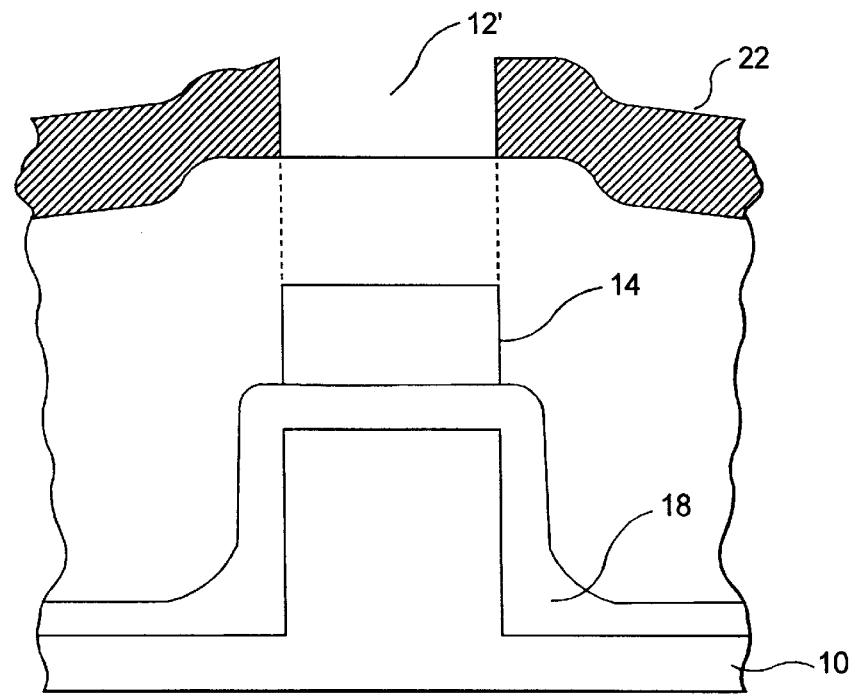

The nitride layer 14 acts as a CMP stop which is exposed free of oxide to allow the subsequent processing step to completely strip off the nitride in a phosphoric acid bath. The phosphoric acid has a temperature in the range of between 100° C.–180° C., and preferably 150° C. The resulting structure is shown in FIG. 7 where the nitride layer 14 is removed, exposing the active regions 2, 4 where active devices may be constructed. However, as the density of integrated circuit structures increases and the physical area available on semiconductor wafers decreases, the gap 13 (FIG. 2) between active regions 2 and 4, for example, becomes more narrow. For example, as gap widths between active regions are approaching the ¼ μm size, it becomes increasingly difficult and expensive to use the standard reverse planarization mask scheme because it requires the printing of very narrow lines (for example photoresist 22 in FIG. 4a) and very narrow spaces (labeled 23') in FIG. 7b. Resolving such fine line and space dimensions are extremely difficult even with expensive, state of the art equipment.

Figure 8A:
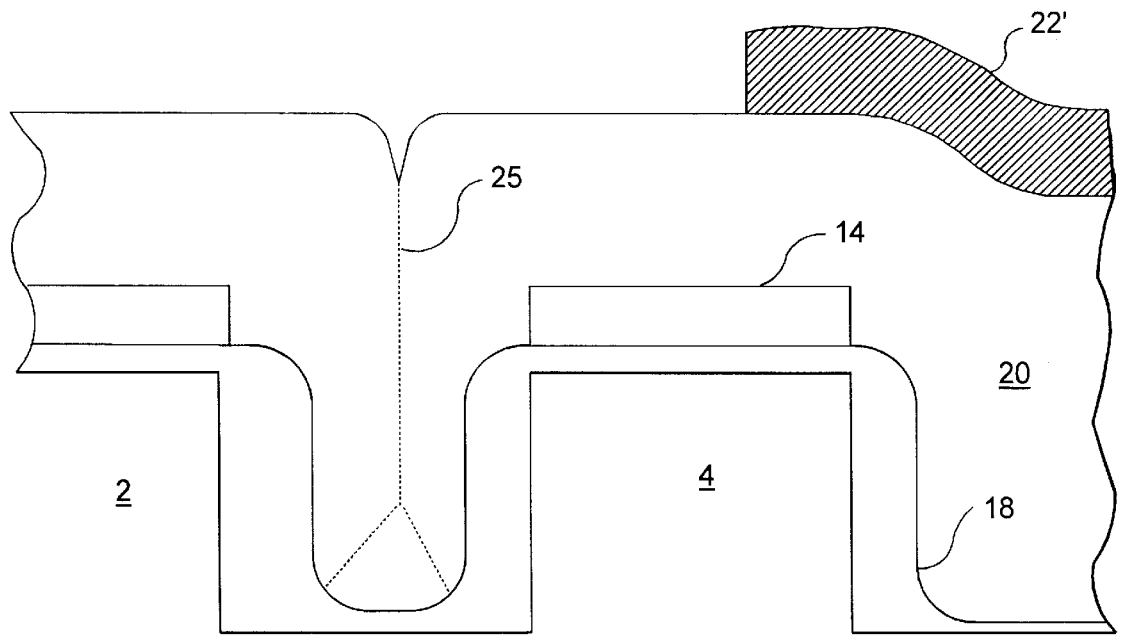
FIGS. 8 and 9 present schematic cross-sectional diagrams showing the relaxed planarization mask being applied according to the present invention.

FIG. 8a presents a cross-sectional side view of the planarization mask 22 produced according to the present invention. FIG. 8a should be compared with FIG. 7b where the conventional reverse mask 22 is applied. The small photoresist line 22 in FIG. 4a is purposely removed in FIG. 8a according to the method of the present invention. By eliminating the thin resist line 22, the necessity of printing fine lines required by the conventional reverse mask scheme is obviated. In areas where narrow spaces are required by the conventional reverse mask scheme (space 23' in FIG. 7b), the current invention will oversize such space, as shown in greater detail in FIG. 8b, such that it can be resolved by conventional lithography processes.

Figure 9A:
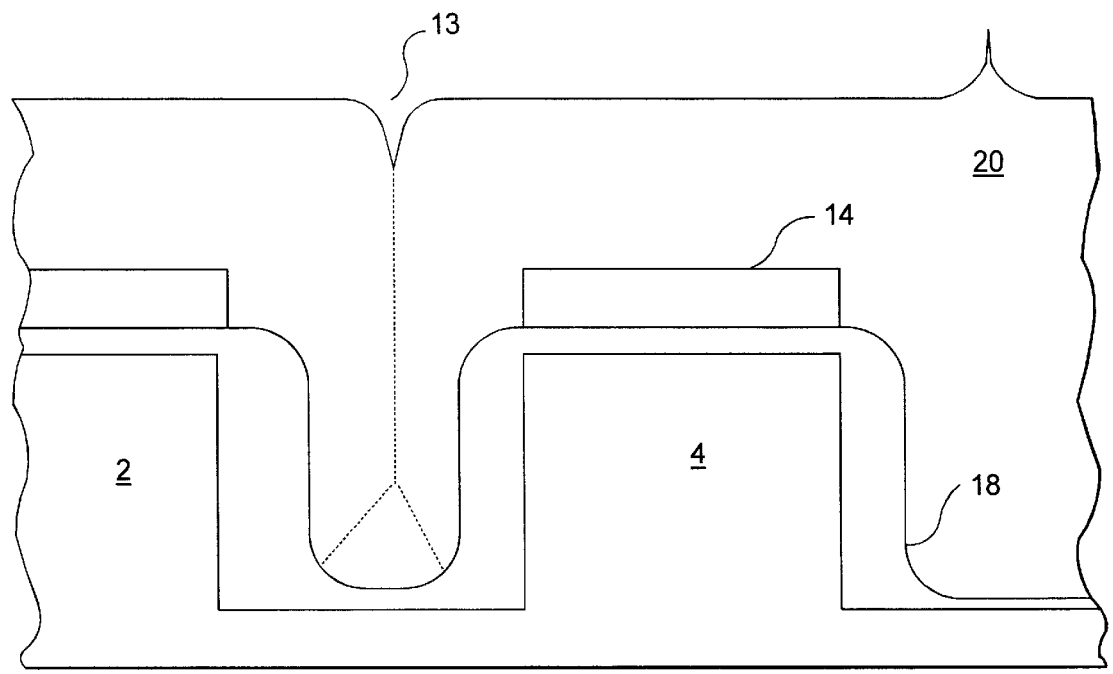

A potential hazard of achieving the structure shown in FIG. 8a is the exposure of a TEOS seam 25 which, during a subsequent etching step, etches much faster than the plain TEOS surface 20. As shown in FIG. 9a, when the TEOS seam 25 becomes overetched, a depression 13 in the field region (TEOS region 20) is formed which acts as a trap for unwanted contaminants. Such unwanted contaminants can cause the devices formed in the active regions 2 and 4, respectively, to short.

Figure 8B:
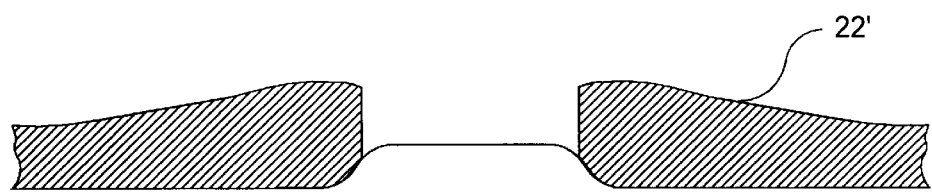
Figure 8B:
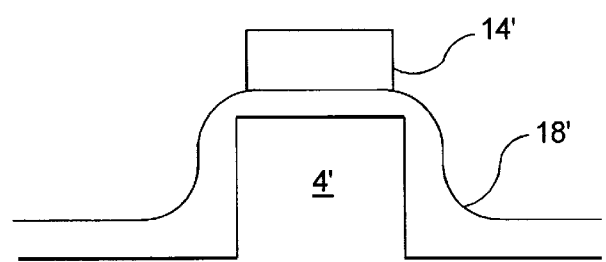
Figure 9B:
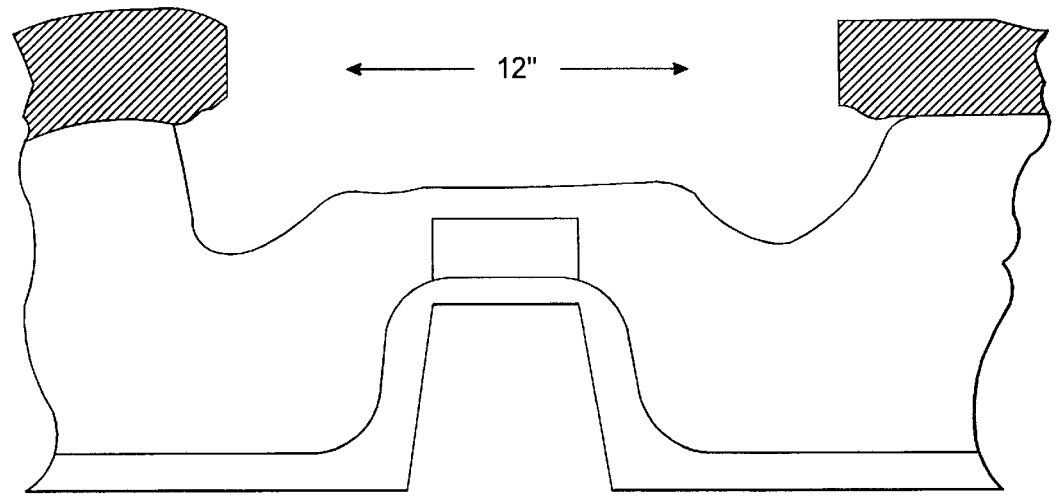

A potential hazard of achieving the structure shown in FIG. 8b is that if the oversized space created according to the method of the present invention is too large, the subsequent etching step will etch into the field region, causing the depression as shown in FIG. 9b. The inventor recognizes, through experimentation, that seams in narrow gaps are stronger (i.e., less likely to be overetched) than those in wider gaps. Therefore, by choosing a maximum width whose seams are strong enough not to be overly etched, fine resist lines can be removed, thereby achieving the relaxed planarization mask geometry shown in FIG. 8a without creating the problems discussed with respect to FIG. 9a. Also helping to prevent excessive seam depression is a properly designed etched target for removing the deposited TEOS such that the maximum seam depression is above the nitride surface 14 so that the subsequent CMP can polish the depression. Such etch target is about 800 Å in the case the of a 6,200 Å TEOS depression layer.

The method of the present invention also provides for a limit to the oversizing of narrow spaces in order to avoid the potential hazard as discussed with respect of FIG. 9b. The recognized limit (or threshold value) is used in the algorithm described below to generate a relaxed planarization mask without compromising the final STI structure.

FIGS. 10a–10d illustrate a flow chart presenting the steps used to form the novel planarization mask according to the present invention. In real application, the steps are performed on a Hewlett-Packard engineer workstation using IC verifier software, produced by Mentor Graphics of San Jose, Calif., which converts the active mask data (input data) into the planarization mask data (output data) which is then used to generate the mask. The relevant portions of the program code © 1997 Advanced Micro Devices, Inc., is presented below as Exhibit A.

The first step 100 (FIG. 10a) in forming the planarization mask of the present convention is to measure the widths of all the active regions. Step 102 requires measuring the widths of the gaps between the active regions. All active regions having a width less than or equal to 0.375 μm which touch an adjacent larger regions (width of greater than 0.625 μm) are removed in step 104. The function of the following steps is to delete small active areas that form part of a larger active piece. These small areas will not present any planarization problems, so they can be ignored. By ignoring small areas, the active area geometry is simplified, allowing more room for subsequent manipulation.

As shown in step 106 if the gap width between adjacent active regions is less than or equal to 0.375 μm and the widths of the adjacent active regions are also less than or equal to 0.375 μm, then you merge the adjacent active regions with the gaps in step 108. If the gap width between the adjacent active regions and the width of the active regions are both greater than 0.375 μm, then reduce the width of the active regions by 0.0625 μm per side in step 110.

Figure 10A:
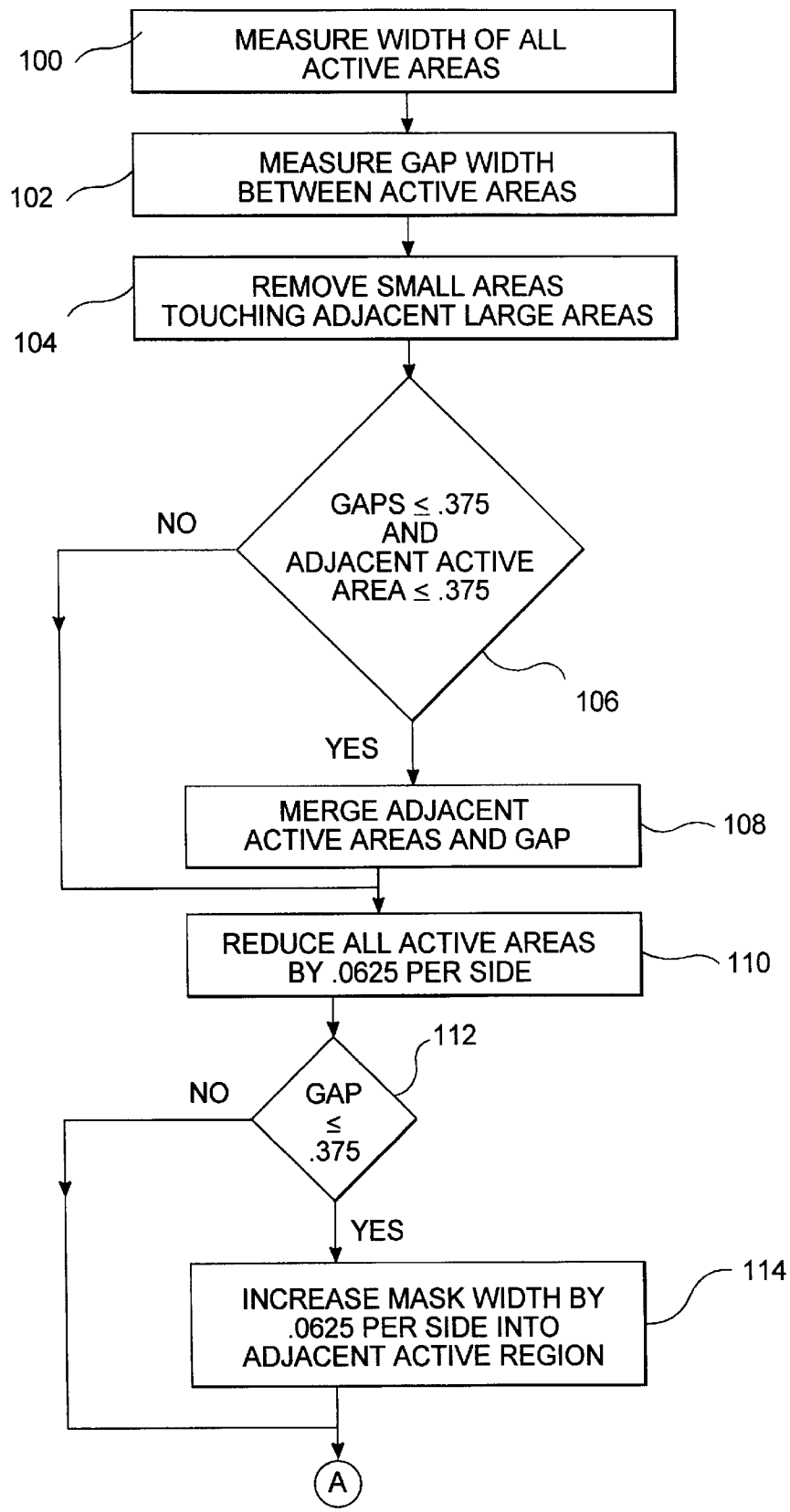
FIGS. 10a–10d depict a flow chart showing the steps performed to provide the planarization mask according to the present invention.
Figure 10B:
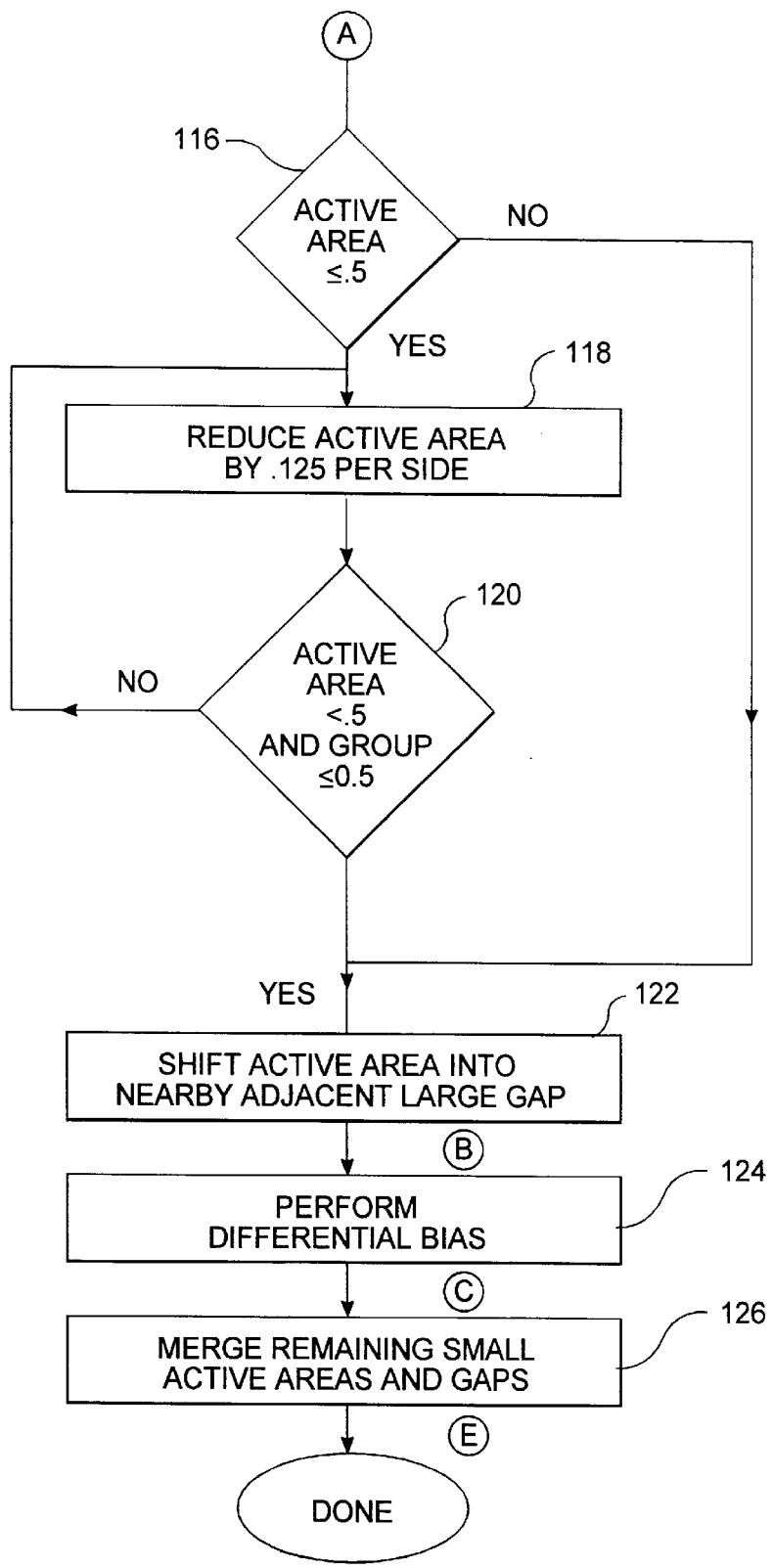
Figure 10C:
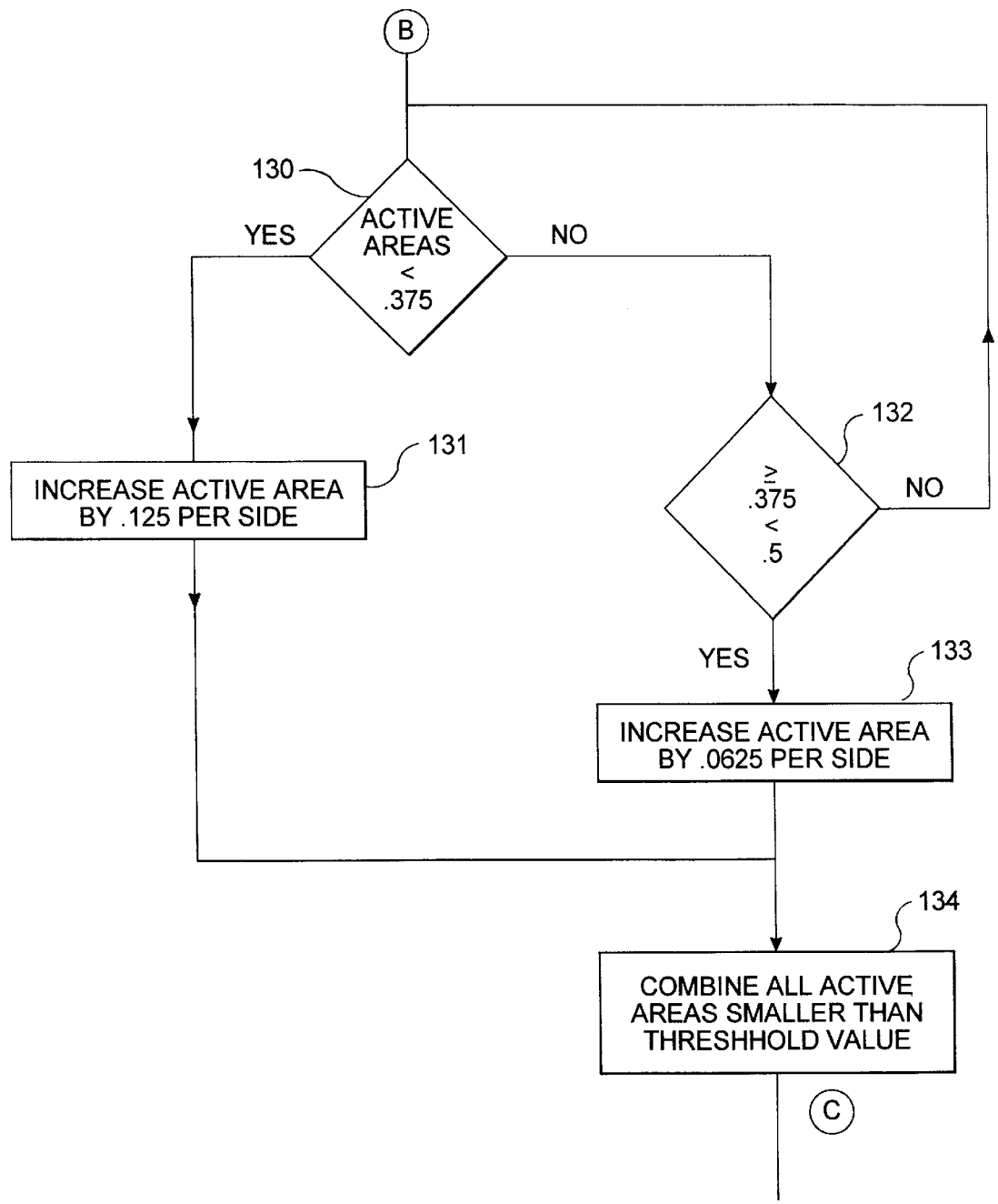

Next, a measurement of the gap width between the active regions is taken in step 112. If the gap width is less than or equal to 0.375 μm, the mask width is increased by 0.0625 μm per side so that the mask partially covers the adjacent active region in step 114. If the gap width between the active regions is greater than 0.375 μm, the width of the active region is measured in step 116 (FIG. 10b). If it is determined in step 116 that the width of the adjacent active regions are greater than 0.5 μm, the active regions are shifted into an adjacent gap in step 122. Steps 118 and 120 provide for the removal of all active regions having a width less than 0.5 μm which are separated by a distance of less than 0.5 μm. After those steps are completed, the very narrow features present in the base structure are removed, thereby relaxing the boundary conditions of the active regions.

In step 124, a differential bias operation is performed on the base structure which results in mostly rectangular surfaces being present on the mask. In step 130 the widths of the active regions are measured. If the width is less than 0.375 μm, the width of the active regions are increased by 0.125 μm per side in step 131. On the other hand, if the width of the active region is between 0.375 μm and 0.5 μm (step 132), the active region is increased by 0.0625 μm per side. Next, all the active regions having a width smaller than a pre-defined value are combined in step 134. In one embodiment of the present invention, all active regions having a width less than approximately 0.5 μm are combined in step 134. After the differential bias of step 124 has been completed, the remaining substructures present on the integrated circuit are cleaned up in step 126.

Figure 10D:
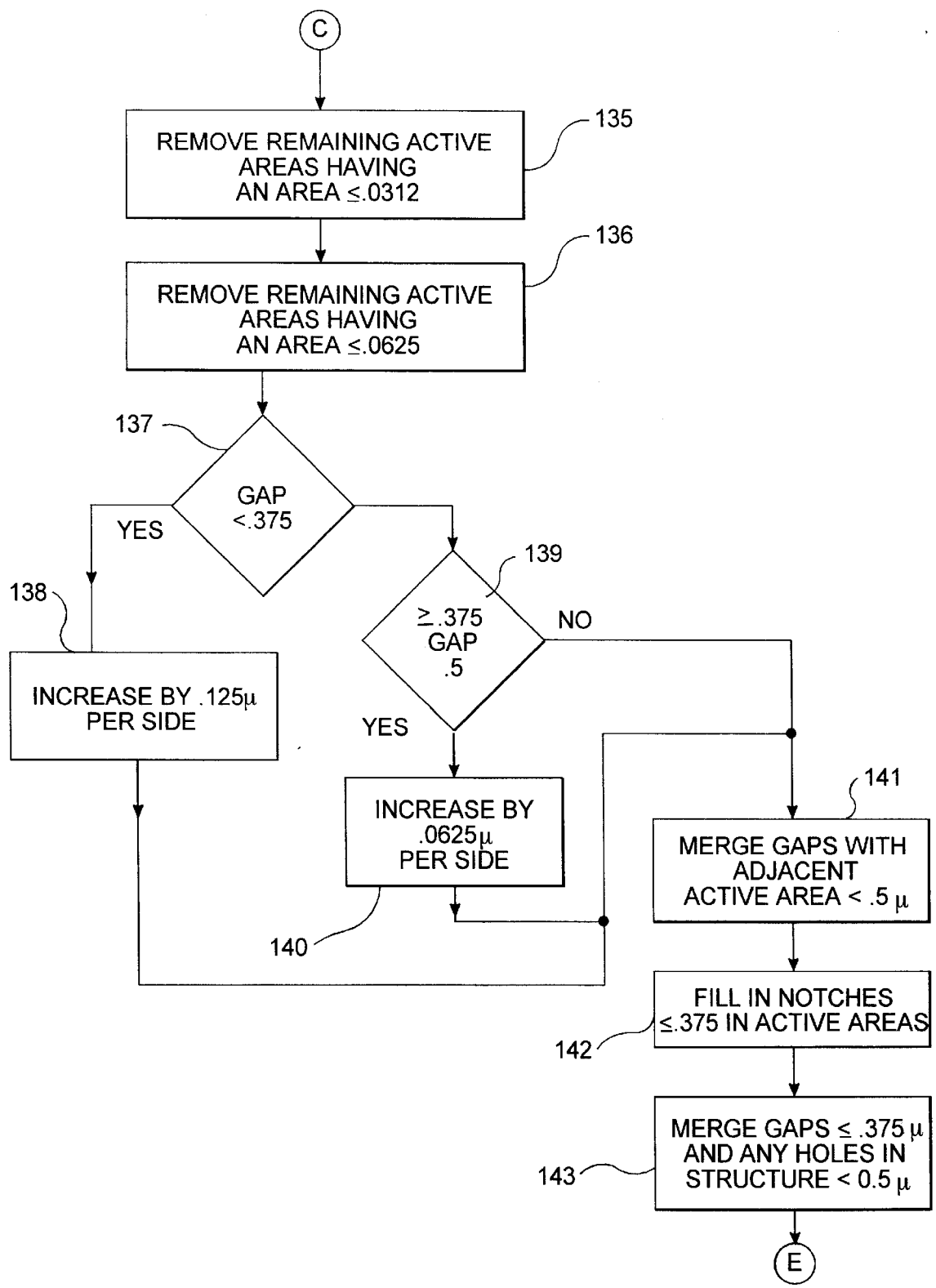

FIG. 10d shows the cleanup process of step 126 in greater detail. After the active regions having a width smaller than below approximately 0.5 μm are merged in step 135, any remaining small substructures having an area less than or equal to 0.0625 μm are removed in step 136. In step 137, remaining if the gap width is less than 0.375 μm, the gap width is subsequently increased by 0.125 μm per side in step 138. If the gap width is between 0.375 μm and 0.5 μm (step 139), the gap width is increased by 0.0625 μm per side in step 140. Next, in step 141, the previously increased gaps are merged with any adjacent active regions having widths less than 0.5 μm. At this point, any notches or openings having widths less than or equal to 0.375 μm are filled in step 142. Finally, any adjacent gaps having widths less than or equal to 0.375 μm are merged together and any holes within the remaining structure less than 0.5 μm are filled in in step 143. At this point all small features present in the base structure have been removed, thereby providing features mask having widths 0.5 μm and higher which are easier to finely and cleanly etch than features present in conventionally developed masks.

Returning to FIG. 10d, after the gap widths of the mask are increased in steps 138 and 140, respectively, the gaps are merged with adjacent active regions having widths less than 0.5 μm in step 141. Notches having widths less than or equal to 0.375 μm are filled in step 142 and finally gaps having widths less than or equal to 0.375 μm are merged and any remaining active regions having widths of less than 0.5 μm are filled in step 143. At this point the polarity of the completed mask is reversed. In general, the reversing of the mask polarity is done at the mask manufacturer.

FIGS. 11–18 provide the top view of the steps used to develop the planarization mask according to the method of the present invention.

Figure 11:
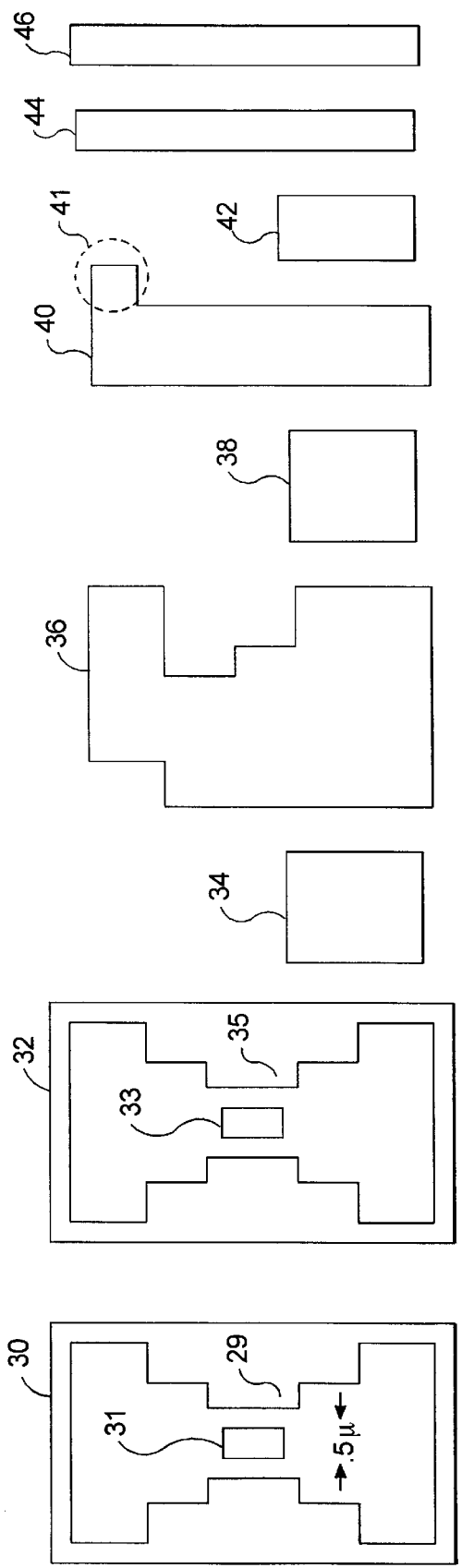

FIG. 11 illustrates the top view of a base integrated circuit structure. In FIG. 11, a plurality of active regions 30–46 are separated by gaps of various widths. For example, active region 30 is separated from active region 32 by a gap width greater than 0.5 μm. Active region 32 is separated from active region 34 by a gap width greater than 0.5 μm. Active region 34 has a width of approximately 0.4 μm and is separated from larger, active region 36 by approximately 0.4 μm. Active regions 38–42 are each separated from one another by a gap width greater than 0.5 μm. Active regions 44 and 46 each have a width of approximately 0.375 μm and are separated by a gap width of approximately 0.375 μm.

Figure 12:
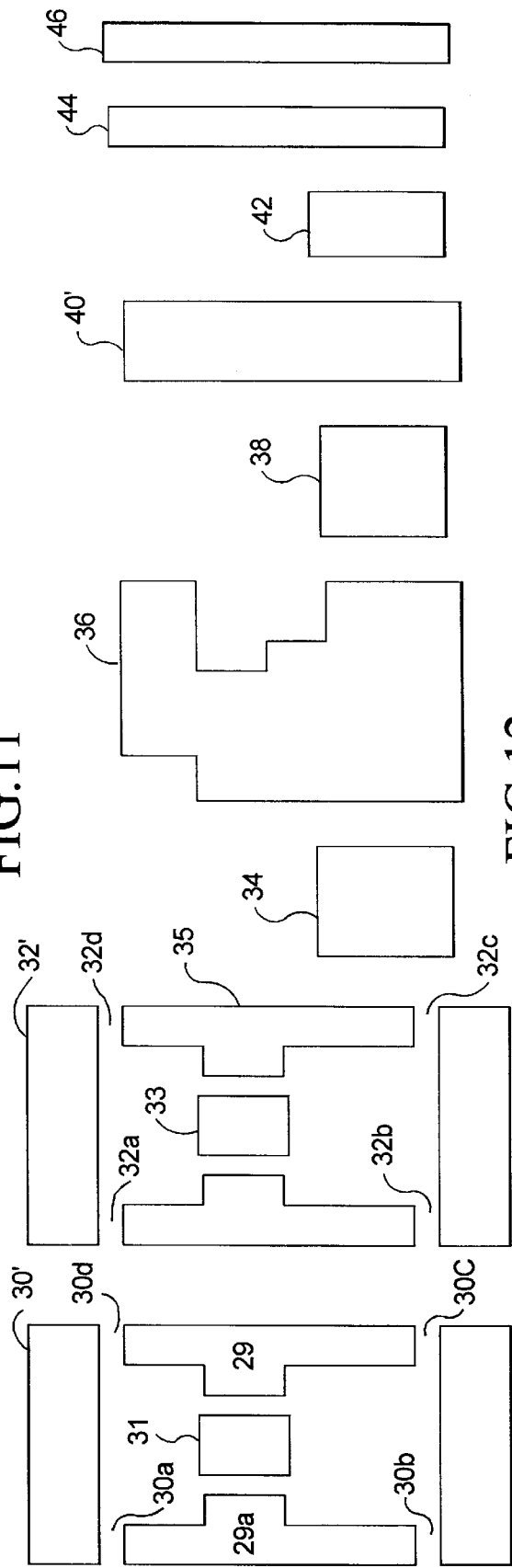

As discussed above, the first steps performed to develop the planarization mask of the present invention steps call for measuring the active regions and removing those active regions having a width less than or equal to 0.375 μm and a total area less than or equal to 0.1875 μm². This results in active regions 30 and 32 being transformed into active regions 30' and 32' having regions 30a–30d being removed from active region 30 and regions 32a–32d being removed from active region 32 as depicted in FIG. 12. Also, as shown in FIG. 12, active region 40' is shown as original active region 40 with extra portion 41 being removed.

Figure 13:
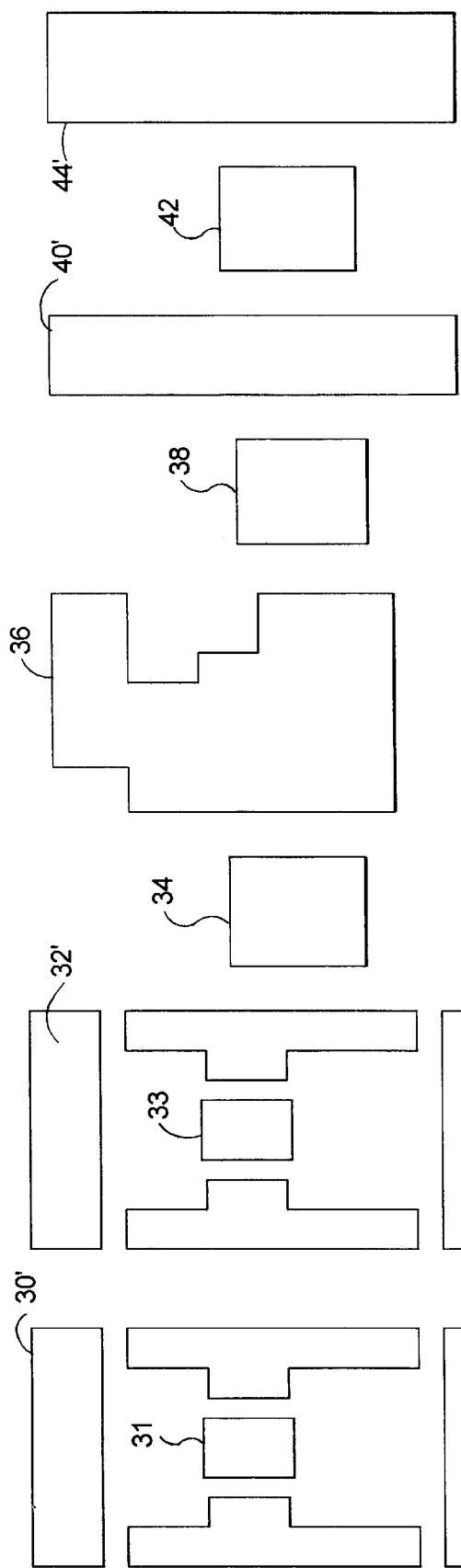

The next step in forming the planarization mask is to merge all active areas having a gap width less than or equal to 0.375 μm when the adjacent active region has a width of less than or equal to 0.375 μm. This results in active regions 44 and 46 being merged to form a new active region 44' as shown in FIG. 13.

Figure 14:
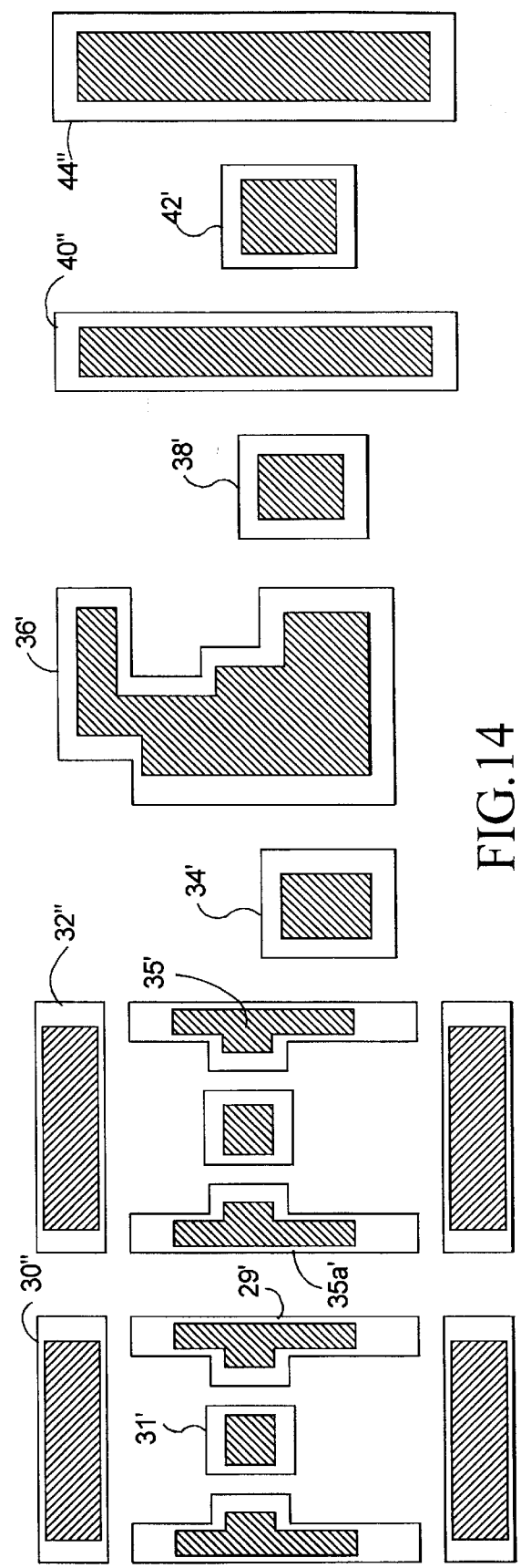

FIG. 14 shows the result of performing step 110 where all active regions are reduced by 0.0625 μm per side with all active regions having a width of greater than 0.625 μm being reduced by 0.0625 μm per side. The slashed regions represent the active regions after being reduced by 0.0625 μm per side. This results in the gap widths between active regions being increased 0.0625 μm per side which results in active regions that are easy to clearly etch.

Figure 15:
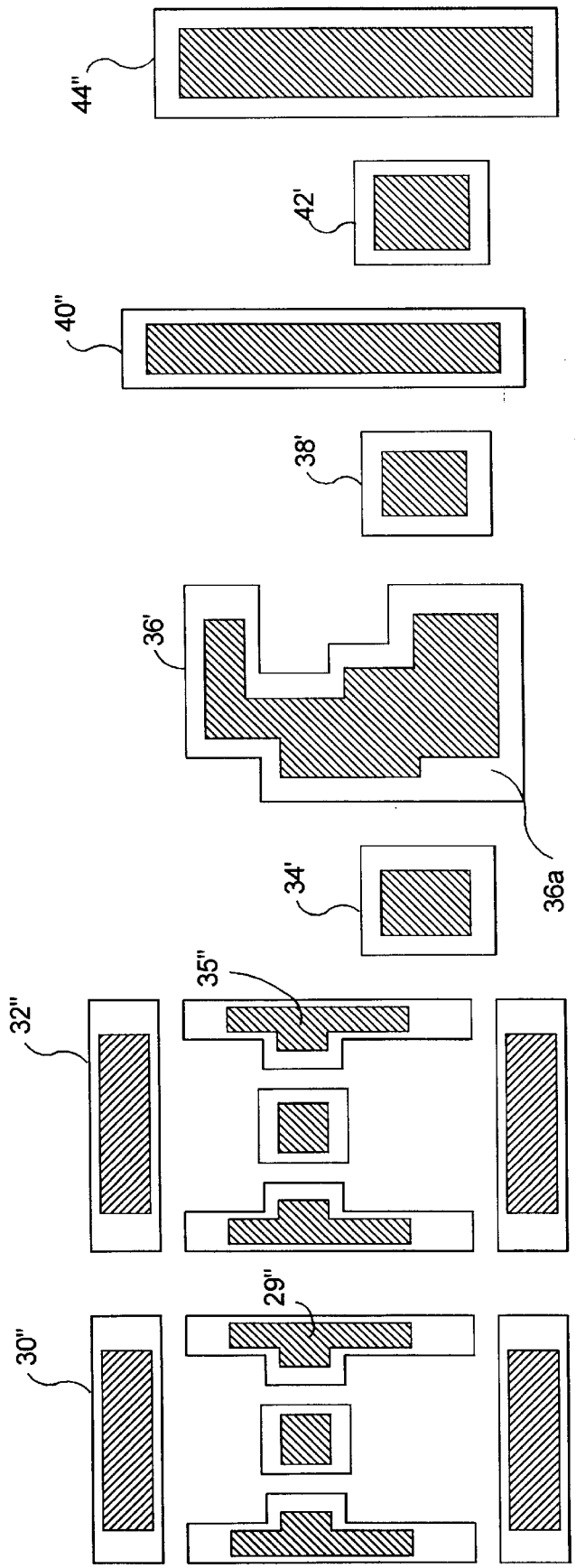

FIG. 15 represents the mask structure according to the present invention after performing steps 112 and 114 where the gap width is increased by 0.0625 μm per side into any adjacent larger active region when the measured gap width is less than or equal to 0.375 μm.

This is shown in FIG. 10 by the newly formed indent 36a in active region 36". Also, as a result of such an operation, element 31' has forced the increase in gap width into elements 29' and 29a' thereby resulting in newly formed elements 29" and 29a". The same effect also occurs in active element 32' where the active element 33 causes the gap width between active region 33 and active regions 35' and 35a' to form new active regions 35" and 35a'.

Figure 16:
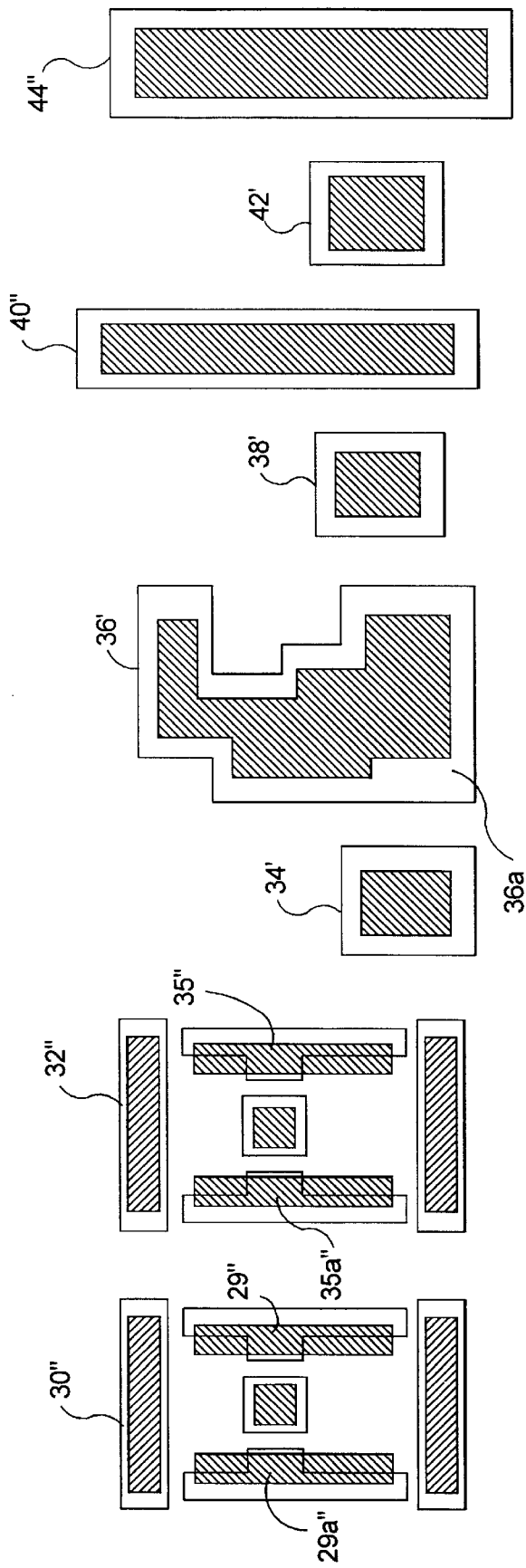

FIG. 16 shows the results of performing step 122 where a portion of the active region is shifted into a nearby adjacent gap when the active region has a width of less than 0.5 μm and a gap width of less than 0.25 μm. Thus, elements 29" and 29a" are now pushed out, thereby forming larger rectangular structures which are easier to etch. Active regions 35" and 35a" are also enlarged.

Figure 17:
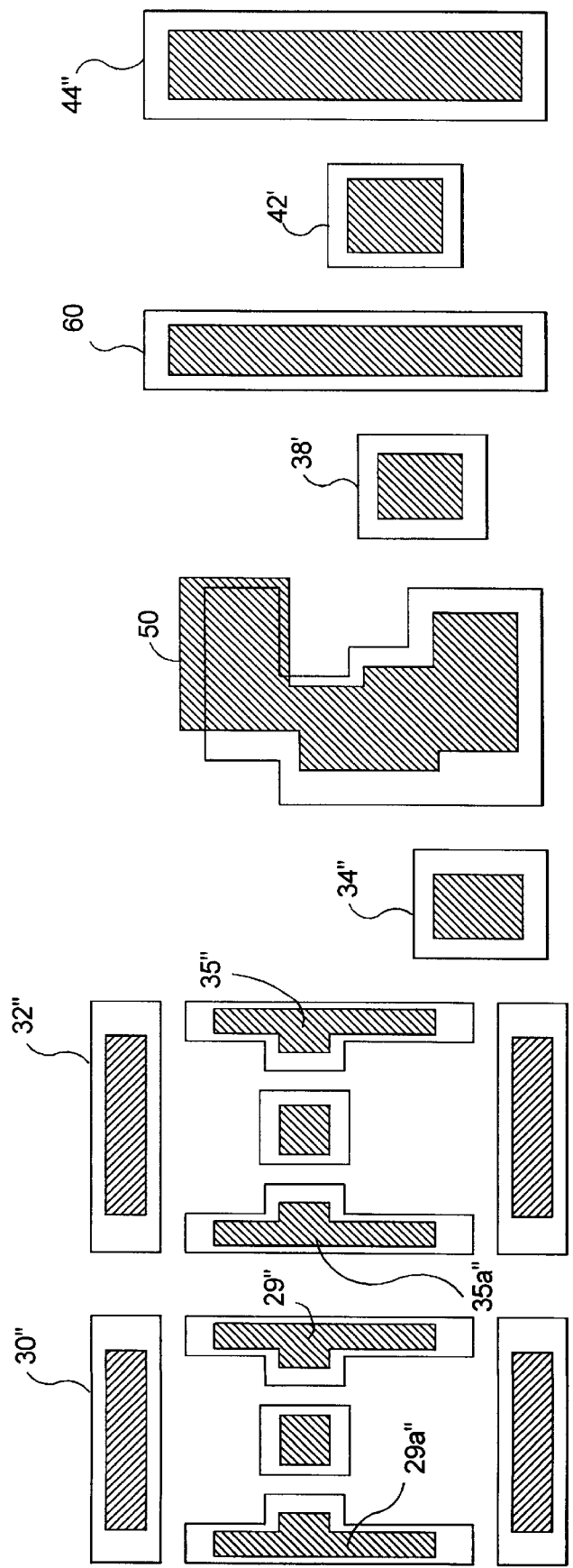

FIG. 17 shows the results after the differential bias of step 124 is performed. The result of the differential bias 124 is that all active regions will have a width of approximately 0.5 μm, thereby making the active regions easy to clean and etch. Differential bias of step 124 causes active region 34' to be increased by 0.0625 μm per side, to form a new active region 34'. The differential bias of step 124 also causes an increase in the active regions of 36" and 40", where each of the active regions is increased by 0.0625 μm per side resulting in new active regions 50 and 60 respectively.

The final step in fabricating the planarization mask of the present invention is to merge and clean up any remaining active regions such that there are no small active features nor a very narrow gap width in the resulting semiconductor structure. An example of the merging process 126 is shown in FIG. 18*a* which illustrates an original base structure 62 having a hole 62*a* formed therein and another active region 64 having a notch 64*a* formed therein. After step 126 is performed, the hole 62*a* is removed thereby forming a new active region 62*a* which is completely filled in. At the same time, the notch 64*a* of previous active element 64 (FIG. 18*a*) is filled in thereby forming rectangular active region 64'.

FIG. 18*b* shows the resulting planarization mask structure according to the present invention. As shown in FIG. 14, active regions 30", 32", 34", 50, 38', 60, 42' and 44' are all generally rectangular in shape and have a width of approximately 0.5 μm. Also, the active regions listed above are all separated from each other by a distance of approximately 0.5 μm which makes the gaps between the active regions much easier to etch than in conventional systems where etching of widths in the ⅛ μm range is sometimes necessary. By forming the planarization mask according to the present invention, larger dimensions and more loose boundary conditions result which provides planarized structure.

The foregoing description of the embodiments has been presented for purposes of illustration and description. It is not intended to be exhaustive or to limit the invention to the precise form disclosed, and obviously, modifications and variations of the invention are possible in light of the above teaching. The generation of a loose planarization mask having relaxed boundary conditions for use in shallow trench isolation processes was described in order to best explain the principles of the invention and its practical application to thereby enable others skilled in the art to best utilize the invention and various embodiments and with various modifications as are suited to the particular use contemplated. It is intended that the scope of the invention be defined by the claims appended hereto.

---
EXHIBIT A
© 1997 Advanced Micro Devices, Inc.
---

```
//Layer Names and GDS Number Assignments
LAYER NWM 2
LAYER NACT 3
LAYER PACT 4
//Special Mask Data
LAYER TCSPEC 35
LAYER L36 36
LAYER L37 37
LAYER L41 41
LAYER SPECIAL 59
LAYER BLOCK 62
//Special LVS Layers
LAYER XCLUDE 6
//LAYER CAPID 21
LAYER BPR 32
//BLOCKPRE = EXTENT
//BLOCK = SIZE BLOCKPRE BY 1.0
//
//_____;
// Mask Layer: 18 PLN    (Planarization)  ;
// Field  :DARK      ;
// Mebes-Unit : 0.125u
//_____;
//setup SDM (R10) first
SDM = OR NACT PACT
R10TM1 = OR SDM L41
//start R18 generation
L35EL37 = TCSPEC ENCLOSE L37
L37IL35 = L37 INSIDE TCSPEC
R18TM3 = R10TM1 NOT L35EL37
R18TM4 = R18TM3 or L37IL35
```

-continued
---
EXHIBIT A
© 1997 Advanced Micro Devices, Inc.
---

```
R18TM5 = R18TM4 NOT L102
//delete small polygons (area <=0.375 x 0.5)touching
large polygons
R18TM610 - INTERNAL R18TM5 <=0.375 REGION OPPOSITE
PARALLEL ONLY
R18TM611 = R18TM5 NOT R18TM610
R18TM612 = INTERNAL R18TM611<=0.375 REGION OPPOSITE
PARALLEL ONLY
R18TM61 = R18TM610 or R18TM612
R18TM62 = AREA R18TM61>0 <=0.188    //round off from
0.1875
R18TM63 = R18TM5 NOT R18TM62.
R18TM64 = R18M62 TOUCH R18TM63
R18TM6 = R18TM5 NOT R18TM64
//merge spaces <=0.375 with polygons <= 0.5
R18TM711 = INTERNAL R18TM6<0.5 REGION PPOSITE PARALLEL
ONLY
R18TM712 = R18TM6 NOT R18TM711
R18TM713 = INTERNAL R18TM712<0.5 REGION OPPOSITE
PARALLEL ONLY
R18TM71 = R18TM711 OR R18TM713    //include corners
and bends
R18TM721 - EXTERNAL R18TM6<=0.375 REGION OPPOSITE
SPACE PARALLEL ONLY
R18TM722 = R18TM6 NOT R18TM721
R18TM723 = EXTERNAL R18TM722<=0.375 REGION OPPOSITE
SPACE PARALLEL ONLY
R18TM72 = R18TM721 or R18TM723    //include corners and
bends
R18TM73 = R18TM72 TOUCH R18TM71
R18TM74 = AREA R18TM73>= 0.14 //round from 0.140625
make sure the overlap is >= 0.375
R18TM7 = R18TM74 or R18TM6
//size down every polygon by 0.06u/side
R18TM8 = SIZE R18TM7 BY –0.06
//size up space by 0.06u from adjacent large polygon
R18TM911 = EXTERNAL R18TM8 <=0.495 REGION OPPOSITE
SPACE PARALLEL ONLY
R18TM912 = INTERNAL R18TM8 < 0.495 REGION OPPOSITE
PARALLEL ONLY
R18TM913 = R18TM911 TOUCH R18TM912
R18TM9131 = R18TM912 TOUCH R18TM911
R18TM914 = INTERNAL R18TM8<0.625 REGION OPPOSITE
PARALLEL ONLY
R18TM915 = R18TM8 NOT R18TM914
R18TM9151 = INTERNAL R18TM915 <0.625 REGION OPPOSITE
PARALLEL ONLY
R18TM9152 = R18TM915 NOT R18TM9151
R18TM9153 = R18TN915 NOT TOUCH R18TM9131 //not part of
small polygon
R18TM916 = COINCIDENT EDGE R18TM9153 R18TM913
R18TM917 = EXPAND EDGE R18TM916 INSIDE BY 0.06
//delete small poloygons <=0.5 x 0.125
R18TM918 = R18TM8 NOT R18TM917
R18TM9181 = INTERNAL R18TM918<0.495 REGION OPPOSITE
PARALLEL ONLY
R18TM9182 = AREA R18TM9181 <= 0.062 //rounded off from
0.0619
R18TM92 = R18TM918 NOT R18TM9182
//shift small polygons <0.495 near minimum space
<=0.495 into nearby large space
R18TM921 = EXTERNAL R18TM92 <=0.495 REGION OPPOSITE
SPACE PARALLEL ONLY
R18TM93 = R18TM912 TOUCH R18TM921
R18TM94 = INTERNAL [R18TM93] <0.495
R18TM95 = EXPAND EDGE R18TM94 OUTSIDE BY 0.12
R18TM96 = R18TM95 NOT R18TM921
R18TM961 = R18TM92 or T18TM96
R18TM971 - R18TM92 NOT R18TM93
//differential sizing
// polygons < 0.375 bias up 0.12u/side
R18TM9711 = INTERNAL R18TM971 <0.375 REGION OPPOSITE
PARALLEL ONLY
R18TM9712 = R18TM971 NOT R18TM9711
R18TM9713 = INTERNAL R18TM9712 <0.375 REGION OPPOSITE
PARALLEL ONLY
```

EXHIBIT A
© 1997 Advanced Micro Devices, Inc.

```
R18TM972 = R18TM9713 or R18TM9711 //included corners
and bends <0.375
R18TM973 = SIZE R18TM972 BY 0.12
//polygons >=0.375<0.495 bias up 0.06u/side
R18TM9731 = INTERNAL R18TM961 >=0.375<0.495 REGION
OPPOSITE PARALLEL ONLY
R18TM9732 = R18TM961 NOT R18TM9731
R18TM9733 = INTERNAL R18TM9732 >=.375 <0.495 REGION
OPPOSITE PARALLEL
ONLY
R18TM974 = R18TM9733 OR R18TM9731 //included corners
and bends >=0.375<0.5
R18TM975 = SIZE R18TM974 BY 0.06
// add all polygons together
R18TM97 = R18TM973 or R18TM975
R18TM98 = R18TM97 or R18TM96
R18TM9 = R18TM98 or R18TM92
//FINAL MERGE AND CLEAN UPS
//delete small active width <=0.25, area <=0.25 × 0.125
R18TM1011 = INTERNAL R18TM9 <=0.25 REGION OPPOSITE
PARALLEL ONLY
R18TM1012 = AREA R18TM1011 <=0.031    //round off from
0.03125
R18TM1013 = R18TM9 NOT R18TM1012
//delete larger polygons again <=0.495, area <=0.495 ×
0.125
R18TM1014 = INTERNAL R18TM1013 <=0.495 REGION OPPOSITE
PARALLEL ONLY
R18TM1015 = AREA R18TM1014 <=0.062    //round off
from 0.06188
R18TM101 = R18TM1013 NOT R18TM1015
//size up narrow spaces and fill them up inside large
polygons
R18TM1021 = EXTERNAL R18TM101 <0.495 REGION OPPOSITE
SPACE PARALLEL ONLY
R18TM10211 = R18TM1021 INSIDE R10TM1
R18TM10212 = INTERNAL R18TM10211 <0.375 REGION OPPOSITE
PARALLEL ONLY
R18TM10213 = SIZE R18TM10212 by 0.12
R18TM10214 = R18TM10211 NOT R18TM10212 //for sizes
>=0.375 <0.5
R18TM10215 = SIZE R18TM10212 BY 0.06
R18TM10221 = R18TM10213 or R18TM10215
R18TM102 = R18TM101 or T18TM10221
//merge small spaces <=0.495 with adjacent small
polygons <0.495
R18TM1031 = EXTERNAL R18TM102 <0.495 REGION OPPOSITE
SPACE PARALLEL ONLY
R18TM1032 = INTERNAL R18TM102 <0.495 REGION OPPOSITE
PARALLEL ONLY
R18TM1033 = R18TM1031 TOUCH R18TM1032
R18TM1034 = AREA R18TM1033 >=.25 //make sure overlap is
>=0.5
R18TM1035 = R18TM102 or R18TM1034
//remove small notches
R18TM1036 = EXTERNAL R18TM1035 <=0.375 REGION OPPOSITE
NOTCH PARALLEL
ONLY
R18TM103 = R18TM1035 OR R18TM1036
//merge small spaces <=0.375
R18TM1041 = EXTERNAL R18TM103 <=0.375 REGION OPPOSITE
SPACE PARALLEL ONLY
R18TM1042 = ARE R18TM1041 >=0.140625    //round off
from 0.140625
R18TM1043 = R18TM103 OR R18TM1042
//and small holes <0.4375 (number from CS34 0.7)
R18TM10441 = HOLES R18TM1043
R18TM10442 = INTERNAL R18TM10441 <0.437 REGION OPPOSITE
PARALLEL ONLY
R18TM104 = R18TM1043 OR R18TM10442    //taking out all
holes <0.5
//selectively bias isolated 0.495×0.495 polygons by
0.035/side (round off from 0.03125)
R18TM1051 = INTERNAL R18TM104 <=0.495 REGION OPPOSITE
PARALLEL ONLY
R18TM1052 = AREA R18TM1051 =<0.246    //round up from
0.24503
R18TM1053 = R18TM104 NOT R18TM1052    //rest of polygons
R18TM1054 = R18TM1052 NOT TOUCH R18TM1053 //not touch
other polygons
R18TM1055 = SIZE R18TM1054 BY 0.035    //round up from
0.03125
R18TM105 = R18TM104 or R18TM1055
//global fracture bias of -0.025/side
R18TM106 = SIZE R18TM105 BY -0.025
//final R18 output
R18 = AND BLOCK R18TM106
R1837 {
    AND BLOCK R18TM106
}
```

What is claimed is:

1. A method of making a planarization mask, comprising the steps of;

(a) measuring dimensions of active areas;

(b) measuring a distance between adjacent active areas;

(c) merging adjacent active areas when the measured distance between the adjacent active areas is less than a first threshold value; and, (d) increasing the dimension of an active area when the width of the active area is greater than a second threshold value.

2. The method of claim 1, wherein the first threshold value has a range of 0.355 $\mu$m–0.375 $\mu$m.

3. The method of claim 1, wherein the second threshold value has a range of 0.5 $\mu$m–0.625 $\mu$m.

4. The method of claim 2, wherein the first threshold value is 0.375 $\mu$m.

5. The method of claim 3, wherein the second threshold value is 0.5 $\mu$m.

6. The method of claim 1, further including the step of:

(e) decreasing the mask size over an active area having a width greater than a third threshold value.

7. The method of claim 6, wherein the third threshold value is 0.625 $\mu$m.

8. A method of forming an integrated circuit structure comprising the steps of:

(a) forming a plurality active areas on a substrate, said active areas forming an integrated circuit structure;

(b) depositing an oxide layer over the active layers;

(c) forming a patterned mask over the oxide layer, the patterned mask having a plurality of openings having a width in registry with the active areas by, (c1) determining the size of the active areas;

(c2) determining the distances between the active areas;

(c3) including in the mask area the distance between the plurality of active areas, inclusive of the active areas, when the distances between adjacent active areas is below a first threshold value;

(c4) including in the mask area the distance between active areas, inclusive of the active areas, when the distance between adjacent active areas is below a second threshold value, the second threshold value being different from said first threshold value; and (c5) reducing the size of an active area when the size of a resulting active area is greater than a third threshold value;

(d) etching the areas not in registry with the mask; and (e) polishing the masked areas to obtain a highly planarized layer over the integrated circuit structure.

9. The method of claim 8, wherein the first threshold value is 0.375 μm.

10. The method of claim 8, wherein the second threshold value is 0.5 μm.

11. The method of claim 8, wherein the third threshold value is 0.625 μm.

12. A method of making an integrated circuit structure having a plurality of adjacent active areas spaced apart by a distance, a method for providing a planarization mask used to form a planarization layer on the integrated circuit structure, comprising the steps of:

(a) measuring the sizes of the individual active areas;

(b) increasing the active areas to merge the adjacent active areas when the distance between adjacent active areas is below a first value; and (c) increasing the size of an active area when the active area has a width smaller than a second value.

13. The method of claim 12, further including the steps of:

(d) reducing the size of an active area when the width of the active area is greater than a third value; and (e) reversing the polarity of the mask.

14. The method of claim 12, wherein the first value is 0.375 μm.

15. The method of claim 12, wherein the second value is 0.5 μm.

16. The method of claim 13, wherein the third value is 0.625 μm.

17. The method of claim 12, wherein step (d) includes the following steps:

(B1) measuring the width of a first individual active area on the semiconductor substrate;

(B2) measuring the width of a second individual active area;

(B3) measuring the distance between the first active area and the second active area; and (B4) merging the resist width covering the first individual active area and the second individual active area when the measured distance between the first and second active areas is a predetermined value.

18. The method of claim 12, wherein the width of the resist mask in step (c) is increased by the value of 0.0625 μm.

19. The method of claim 13, wherein the size of the resist mask in step (d) is reduced by 0.0625 μm per side.

* * * * *